(12) United States Patent
Schropp et al.

(10) Patent No.: US 7,871,940 B2
(45) Date of Patent: Jan. 18, 2011

(54) APPARATUS AND PROCESS FOR PRODUCING THIN FILMS AND DEVICES

(75) Inventors: Rudolf Emmanuel Isidore Schropp, Driebergen (NL); Catharina Henriette Maria Van Der Werf, Utrecht (NL); Bernd Stannowski, Westervoort (NL)

(73) Assignee: Universiteit Utrecht Holding B.V., Utrecht (NL)

( * ) Notice: Subject to any disclaimer, the term of this patent is extended or adjusted under 35 U.S.C. 154(b) by 611 days.

(21) Appl. No.: 10/592,364

(22) PCT Filed: Mar. 3, 2005

(86) PCT No.: PCT/EP2005/002370

§ 371 (c)(1),
(2), (4) Date: Aug. 30, 2007

(87) PCT Pub. No.: WO2005/095669

PCT Pub. Date: Oct. 13, 2005

(65) Prior Publication Data

US 2008/0128871 A1    Jun. 5, 2008

(30) Foreign Application Priority Data

Mar. 12, 2004    (EP) ................... 04075801

(51) Int. Cl.
*H01L 21/31* (2006.01)
(52) U.S. Cl. ................. 438/778; 438/787; 438/791; 257/E21.293; 118/715; 118/724
(58) Field of Classification Search ............ 438/791, 438/778, 787; 118/715, 716, 724; 257/E21.293
See application file for complete search history.

(56) References Cited

U.S. PATENT DOCUMENTS 5,135,608 A * 8/1992 Okutani ............... 438/584

(Continued)

FOREIGN PATENT DOCUMENTS

WO    WO 98/28463    * 7/1998

OTHER PUBLICATIONS

Sato Hidekazu et al., "Ultrathin Silicon Nitride Gate Dielectrics Prepared By Catalytic Chemical Vapor Deposition At Low Temperatures" Applied Physics Letters, Amercan Institute of Physics. vol. 77, No. 17, p. 2752-2754, © 2000.

(Continued)

*Primary Examiner*—Hsien-ming Lee
(74) *Attorney, Agent, or Firm*—Harness, Dickey & Pierce, P.L.C.

(57) ABSTRACT

A silicon nitride thin film formation apparatus is provided for stationary and moving substrates and a process for forming such films. The process provides high uniformity of film thickness and film properties as well as a high deposition rate. The film properties are adequate for application as an antireflection layer or passivation layer in solar cell devices or as dielectric layer in thin film transistors. The apparatus includes a number of metal filaments. In the space within the formation apparatus opposite to the substrate with respect to the filaments, a gas dosage system is arranged at a predetermined distance of the filaments. The film formation apparatus for stationary substrates also contains a shutter to control the starting and ending conditions for film formation and to control the film thickness.

18 Claims, 3 Drawing Sheets

U.S. PATENT DOCUMENTS

| | | |
|---|---|---|
| 6,432,206 B1 | 8/2002 | Tolt |
| 7,300,890 B1 * | 11/2007 | Wang .......................... 438/791 |
| 2001/0052596 A1 | 12/2001 | Meiling et al. |

OTHER PUBLICATIONS

A. Kikkawa et al., "Electrical Properties of Silicon Nitride Films Deposited by Catalytic Chemical Vapor Deposition on Catalytically Nitrided Si(100)" Thin Solid Films Sequoia, vol. 430, No. 1-2, p. 100-103, © 2003.

H Sato et al., "Low-k Silicon Nitride Film for Cooper Interconnects Process Prepared by Catalytic Chemical Vapor Deposition Method at Low Temperature" Thin Solid Films, Elsevier Sequoia, vol. 395, No. 1-2, p. 280-283, © 2001.

* cited by examiner

APPARATUS AND PROCESS FOR PRODUCING THIN FILMS AND DEVICES

The present invention relates to an apparatus for providing thin film semiconductor devices, in particular solar cells and thin film transistors. Furthermore the invention relates to a process for forming such semiconductor devices and to the devices obtainable by such a process. Solar cells incorporating microcrystalline silicon or polycrystalline silicon are employed to generate electricity from incident light irradiation.

The above mentioned semiconductor devices often comprise a silicon nitride film. Silicon nitride formation methods in general require that the formation rate for the film is high, in the order of 1 to 10 nm/s, and that the film formation apparatus is inexpensive. Known apparatuses for silicon nitride formation providing a high deposition rate are relatively expensive, use large quantities of source materials and, in most cases, additional carrier gases, and have high electrical power consumption due to the nature of the power supplies used. Examples are apparatuses comprising Microwave Plasma Enhanced Chemical Vapor Deposition (MWPECVD) or Expanding Thermal Plasma (ETP). Both apparatuses decompose the gases remotely from the substrate.

The object of the present invention is to provide an inexpensive film formation apparatus and an efficient film formation method to provide silicon nitride layers at a relatively high formation rate.

The invention provides an apparatus for forming thin film semiconductor devices, comprising:

a deposition chamber which can be evacuated via a pumping system, a number of filaments which are arranged in the deposition chamber, which filaments can be coupled to an exterior electrical power source;

a gas dosage system which is arranged at a predetermined distance of the filaments for introducing gases into the deposition chamber.

The apparatus provides a high thickness uniformity and high deposition rate. The present invention concerns a film formation apparatus and a film formation method for silicon nitride films. In particular, it relates to a method for the formation of silicon nitride films that are adequate for application as the antireflection and/or passivating layer in solar cell devices and as the insulating and/or passivating layer in thin film transistors. Moreover, the film formation apparatus and method have the desired property that they result in improved electronic properties of multi- or polycrystalline silicon wafers.

According to a second aspect the present invention provides a method for forming thin films.

According to a third aspect the invention provides a semiconducting device produced using an apparatus and/or a method as described above.

Further advantages, features and details of the present invention will be described in conjunction with the enclosed figures in which.

Figure 1:
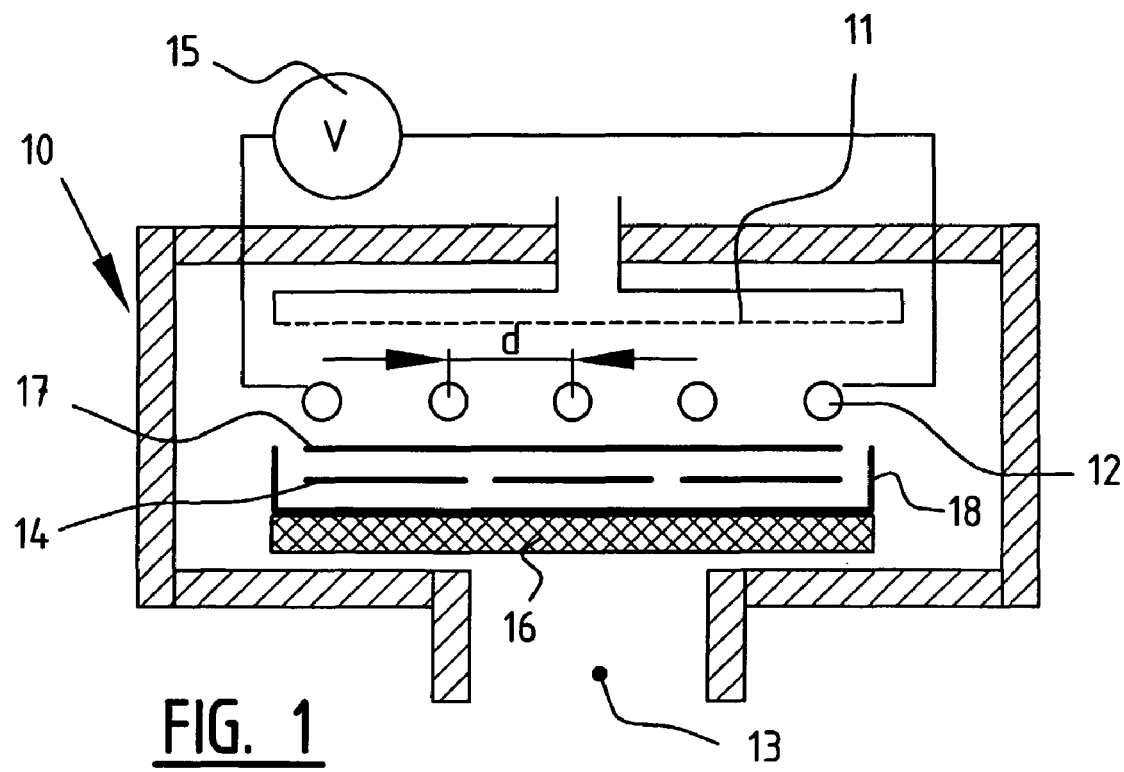
FIG. 1 is a schematic side view of an apparatus according to the present invention in a first preferred embodiment.

FIG. 1 shows an apparatus 10 comprising a deposition chamber with a filament wire assembly and gas dosage system according to the present invention. The film formation apparatus 10 comprises a gas dosage system 11 for introducing a gas or a mixture of gases, multiple filament wires 12, and a gas outlet 13 connected to a pumping system for decreasing the pressure in the apparatus. One or multiple substrates 14 can be arranged opposite from the gas dosage system 11 with respect to the multiple filament wires 12. The filament wires are heated by passing a current through them from power supply 15. The power supply can be either an alternating current (ac) or direct current (dc) supply.

The substrates 14 are heated during the film formation process by the filament wires 12. The film formation process can be conducted such that no additional heating of the substrates 14 is needed, thus reducing the cost of manufacturing of the films. If desired the substrates 14 can be heated by an additional heater 16 which is arranged in contact or in proximity with substrate carrier 18. The apparatus may also contain a shutter 17 to shield the substrates from the filament wires. The shutter is moveable parallel to the substrates between a first open position, wherein the shutter is removed from between the substrates 14 and the filaments 12, and a second closed position wherein the shutter is placed between the substrates and the filaments as shown in FIG. 1.

Figure 2:
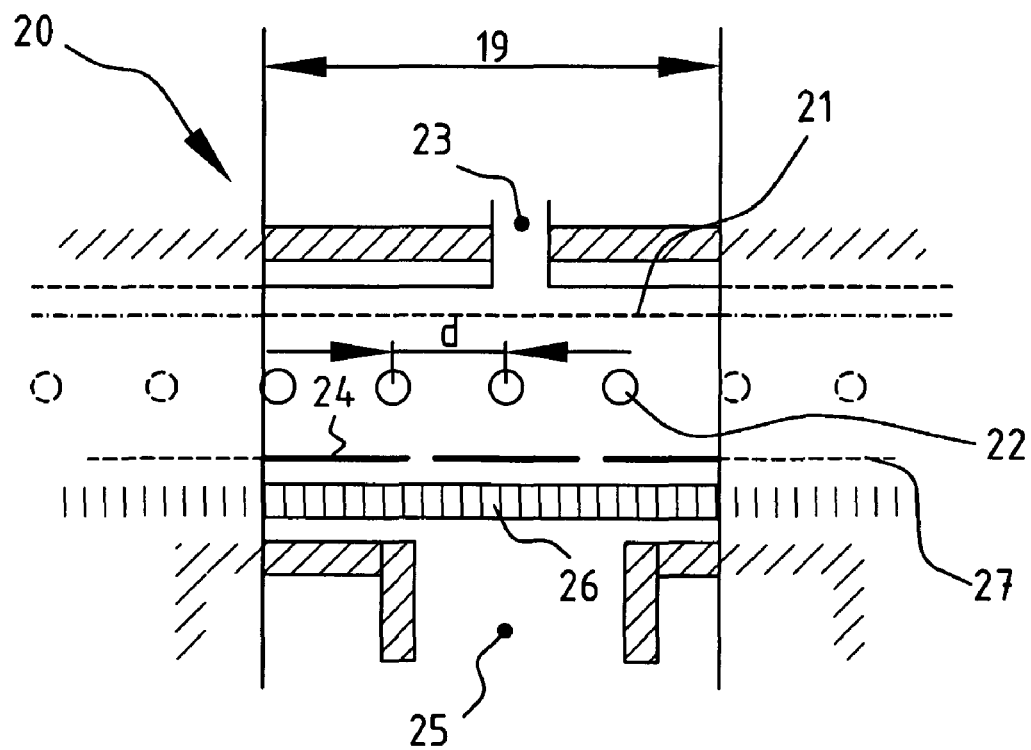
FIG. 2 is a schematic side view of an apparatus according to the invention in a second preferred embodiment.

An aspect of the present film formation apparatus is that the area that the substrates occupy can be extended in the plane of the substrates. This extension is substantially unrestricted. FIG. 2 shows how the area for film formation can be enlarged by adding deposition chambers 19 adjacent to one another in a film formation apparatus 20.

To achieve a uniform film over the entire length of the multiple substrates 24, the number of filament wires 22 is increased. The length of each of the filament wires 22 is longer than the total width of the substrates. The sum of the distances d between the filaments is greater than the total length of the substrates. The gas dosage system 21 has a length and width larger than the added length and width of the substrates and may have multiple gas inlet lines 23.

Likewise the substrates 24 arranged on the carrier 27 may be moving linearly, for instance if the carrier is a belt conveyor. In this case the number of filaments and their relative distances are irrelevant for obtaining a uniform coating. The gas dosage system 21 however must have a length greater than or equal to the length of the total summed distances d between the filament wires 22. Depending on the size of the apparatus 20, multiple gas exhausts 25 may be necessary. If needed, additional heating of the substrates is possible by additional arrays of heaters 26 arranged below substrate carrier 27. Also one or more shutters may be provided corresponding to the shutter 17 of FIG. 1.

To achieve a uniform film over the entire width of the substrates, the length of the filament wires 22 has to be considerably larger then the width of all substrates together, preferably extending more than 5 cm on each side. Also the width of the gas dosage system has to wider than the width of all substrates together.

A second improvement of the present film formation apparatus is that the substrates can be stationary or moving, while both stationary and linearly moving substrates are coated uniformly with the film in this arrangement. In the case of moving substrates, the thickness of the obtained films is controlled by the number of filaments and the linear speed. In case of stationary substrates the thickness of the films is controlled by the film formation time.

Figure 3:
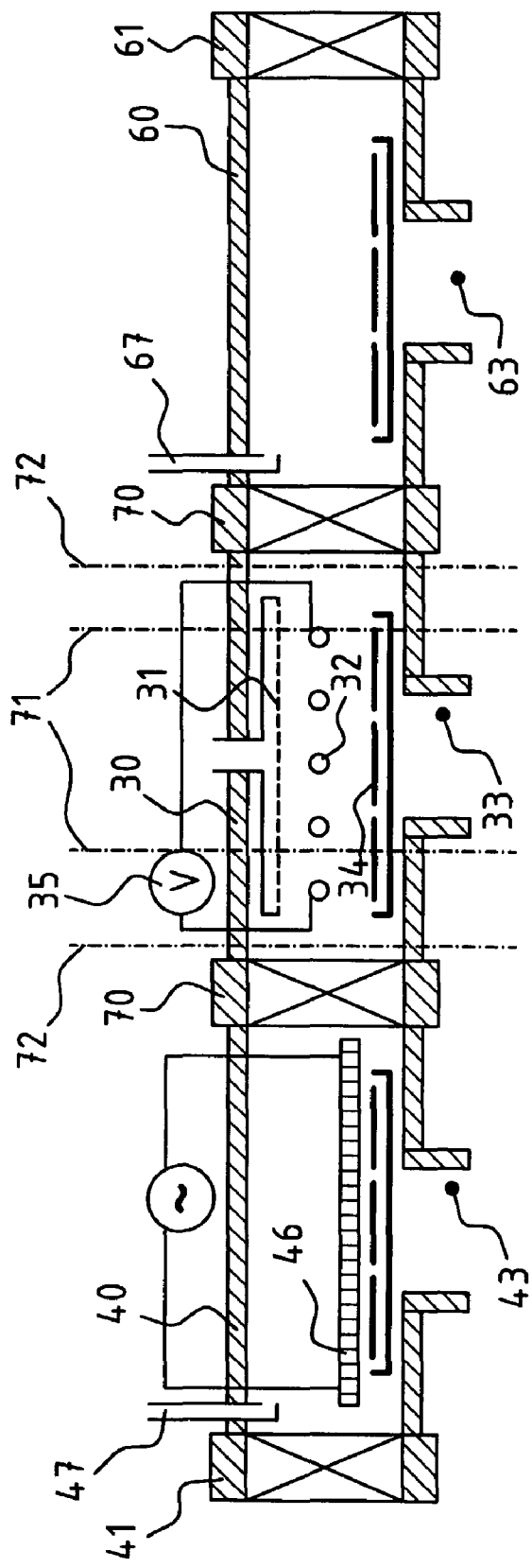
FIG. 3 is a schematic side view of an apparatus according to the present invention in a third preferred embodiment.

In a preferred embodiment of the present film formation apparatus the arrangement of gas dosage system 11 or 21, multiple filament wires 12 or 22, optional heaters 16 or 26, and substrates 14 or 24, can be placed either horizontally or vertically. In the latter case, FIGS. 1 through 3 represent schematic cross sectional top views of the respective arrangements.

Both in the first and second embodiment of FIGS. 1 and 2 respectively, the distance d between the metal filaments is between 2 and 7 cm. The distance between the filaments and the substrate is between 2 and 5 cm, and the distance between the gas dosage system and the filaments is between 1 and 6 cm, and preferably, these distances are between 3 and 4 cm, 3 and 4 cm, and 2 and 4 cm, respectively.

In a process according to the invention the samples are arranged in a vacuum and preheated by the filaments. Heating the filaments is done by passing a current through them such that the filaments reach a temperature between 1800 and 2500° C., and preferably between 2100° C. and 2300° C. The heating step lasts about 1 hour, with the shutter 17 in the closed position.

At the above mentioned wire filament temperature, the substrates facing the filaments will reach a temperature between 300 and 600° C., preferably between 400° C. and 500° C. If necessary, the substrates can be heated additionally by additional heaters 16, 26.

Subsequently the gas supply is set to a mixture of silane ($SiH_4$) and ammonia ($NH_3$) with a ratio between 1:50 and 1:9, and preferably between 1:20 and 1:10. The total gas flow rate is higher than 4 sccm per $cm^2$ of substrate area to be deposited on, and preferably higher than 10 sccm per $cm^2$ of substrate area. The gas pressure is in the range of 0.05 mbar to 0.5 mbar, and preferably between 0.1 and 0.4 mbar. Next, the substrates are exposed to the reactive gas atmosphere by opening the shutter 17 for a predetermined time to achieve the desired film thickness, and closing the shutter immediately after the predetermined time. After closing the shutter the gas flow is stopped, a wait time in excess of 1 minute is taken, and the filament wire current is switched off. The substrates with the predetermined film thickness are left to cool down to 300° C. before transporting them out of the apparatus via an intermediate chamber such that the film formation apparatus itself is not exposed to air. The cooling can be accelerated by purging the apparatus with inert gas, e.g. argon or nitrogen.

A third preferred embodiment of a film formation apparatus for moving or stationary substrates with a large total area is designed as follows (FIG. 3). The total area of the substrates may be in excess of 1 m×1 m. The film formation chamber 30 is placed between a first load lock chamber 40 (entrance load lock chamber) and a second load lock chamber 60 (exit load lock chamber). The dash-dot lines 71 indicate where the chamber deposition zones can be interposed according to the method as shown in FIG. 2.

The first and second load lock chambers 40 and 60 are connected to the film formation chamber via separation valves 70. The first and second load lock chambers have a load valve 41 and an unload valve 61. The entrance load lock chamber 40 is equipped with a heater element 46, a gas inlet 47, and gas exhaust 43. The exit load lock chamber 60 is equipped with a gas inlet 67 and gas exhaust 63, and may be equipped with a cooling stage (not shown in FIG. 3).

To make the apparatus suitable for moving substrates, the film formation chamber 30 is extended by interposing deposition-free zones at the dash-dot lines 72, such that the total area of substrates can be in the chamber 30 without film formation taking place thereon. To prevent film formation in the film formation chamber 30 but outside the deposition zone, extra shields or shutters may be added.

For stationary substrates the film formation chamber 30 may comprise a shutter as in FIG. 1 (not shown in FIG. 3). In addition, extra load lock chambers or chambers with cassette systems may be added before the entrance load lock chamber 40 and after the exit load lock chamber 60 to improve operational safety and operational speed.

A process according to the present invention using the apparatus of FIG. 3 is described herein below.

The multiple substrates, for instance positioned on a tray, are loaded in the first load lock chamber 40 (entrance load lock chamber). The load lock chamber is equipped with a heater element 46 to uniformly heat the substrates to the desired temperature. After closing the loading door 41, the chamber is pumped down to high vacuum, below $10^{-6}$ Torr, and subsequently filled with the process gas (composition as specified hereafter), and the chamber is kept at a suitable pressure for heating the substrates.

During the above heating process in the film formation apparatus, the process is already running for at least 30 minutes, using the following parameters. The filament temperature is about 2100° C. the total gas flow is in excess of 4 sccm per $cm^2$ of gas dosage system area, and preferably higher than 10 sccm per $cm^2$ of gas dosage system area, the gas flow ratio of silane ($SiH_4$) and ammonia ($NH_3$) is between 1:50 and 1:9, and preferably between 1:20 and 1:10; the gas pressure is in the range of 0.05 mbar and 0.5 mbar, and preferably between 0.1 and 0.4 mbar.

A. Procedure for Moving Substrates.

The pressure in the first load lock chamber 40 is made equal to that in the film formation apparatus. A first separation valve 70 between the load lock chamber 40 and the film formation chamber 30 is opened and the substrates are moved through the film formation apparatus at a predetermined linear speed. The speed is in accordance with the desired film thickness, taking into account the film formation rate and the length of the deposition zone, which is determined by the total summed distances d between the filament wires. The substrate temperature during the film formation is maintained by the radiation from the filament wires between 300 and 600° C., preferably between 400° C. and 500° C.

When all substrates have completely moved from out of the deposition zone, a second separation valve 70 is opened, to allow entrance into a third chamber 60 (exit load lock chamber) which was already filled with the process gas or similar gas and kept at a pressure approximately equal to that in the film formation chamber 30. After closing the second separation valve, the exit load lock 60 can be purged until all toxic and/or flammable gases are removed, such that the exit load lock can be opened to remove the coated substrates. The cooling can be accelerated by purging the apparatus with inert gas, e.g. argon or nitrogen.

The throughput of the entire film formation process can be accelerated by adding chambers with cassette systems before the first load lock and after the second load lock.

B. Procedure for Stationary Substrates.

In case of stationary substrates, a shutter 17 is present in the film formation chamber. The shutter in the film formation chamber is in the closed position. A first separation valve 70 between the load lock chamber 40 and the film formation chamber 30 is opened and the substrates are moved and positioned in a central location with respect to the gas dosage system and the multiple filament arrangement.

Next, the substrates are exposed to the reactive gas atmosphere by opening the shutter for a predetermined time to achieve the desired film thickness, and closing the shutter immediately after the predetermined time.

Subsequently a second separation valve 70 is opened, to allow entrance into a third chamber 60 (exit load lock chamber), which was already filled with the process gas or a similar gas, in this case for instance $N_2$, and kept at a pressure approximately equal to that in the film formation chamber.

The substrates are completely moved to the exit load lock chamber 60, the second separation valve is closed, the exit load lock is then purged until all toxic and/or flammable gases are removed, such that the exit load lock can be opened to remove the coated substrates. The cooling can be accelerated by purging the apparatus with inert gas, e.g. argon or nitrogen.

The throughput of the entire film formation process can be accelerated by adding chambers with cassette systems before the first load lock and after the second load lock.

First Example of a Silicon Nitride Film Formation Process in a Chamber for Stationary Substrates:

The film formation process for stationary substrates was conducted on a glass substrate on Dec. 5, 2002, run number P3020, as follows. In this case the film formation apparatus is equipped with a shutter. The samples were preheated by the filaments in vacuum in the film formation apparatus, by passing a current through the filaments, such that they reached a temperature of 2100° C. for 1 hour, with the shutter in the closed position. Next, the gas supply was set to a mixture of 22 sccm silane ($SiH_4$) and 300 sccm ammonia ($NH_3$) and the pressure was set to 0.2 mbar. Then, the substrates were exposed to the reactive gas atmosphere by opening the shutter. The shutter was opened for 10 minutes and then quickly closed. When the gas flow is stopped, a wait time in excess of 1 minute is taken, and the filament wire current is switched off. Then, the substrates with the predetermined film thickness are left to cool down to 300° C. before transporting them out of the apparatus via an intermediate chamber so that the film formation chamber itself is not exposed to air. The cooling can be accelerated by purging the apparatus with inert gas, e.g. argon or nitrogen.

The thickness of this film P3020 was 1850±10 nm, which implies that the deposition rate was 3.1 nm/s. The refractive index (n) at 2.0 eV (wavelength 620 nm) is 1.96±0.05 and the extinction coefficient (k) at 3.1 eV (wavelength 400 nm) is <0.001. The hydrogen content of the layer is 11.5±0.5 at.-%.

Second Example of a Silicon Nitride Film Formation Process in a Chamber for Stationary Substrates:

The film formation process was conducted on a crystalline silicon wafer on Dec. 13, 2002, run number P3035, according to the same method as the first example, except that the duration that the shutter was opened was 25 s.

The thickness of this film P3035 was 75±5 nm, due to a deposition rate of 3 nm/s. The refractive index (n) at 2.0 eV (wavelength 620 nm) is 2.0±0.1 and the extinction coefficient (k) at 3.1 eV (wavelength 400 nm) is <0.002. Upon visible inspection the reflective color of the layer on the crystalline silicon wafer was dark blue.

Third Example of a Series of Silicon Nitride Film Formation Processes in a Chamber for Stationary Substrates:

A series of thin film formation processes was conducted on glass substrates between Nov. 19, 2002 and Dec. 16, 2002, run numbers are within the range P2996 and P3038. In this series, the $SiH_4$ flow was chosen differently for each film formation process while all other parameters were kept the same as in the first and second examples, except that the duration that the shutter was opened was arbitrarily chosen.

The refractive index (n) at 2.0 eV (wavelength 620 nm) could be varied between 1.9±0.05 and 2.12±0.05, by varying the $SiH_4$ flow from 11 sccm and 33 sccm while the flow of ammonia was maintained at 300 sccm. The extinction coefficient (k) at 3.1 eV (wavelength 400 nm) is <0.002 for all films.

Figure 4:
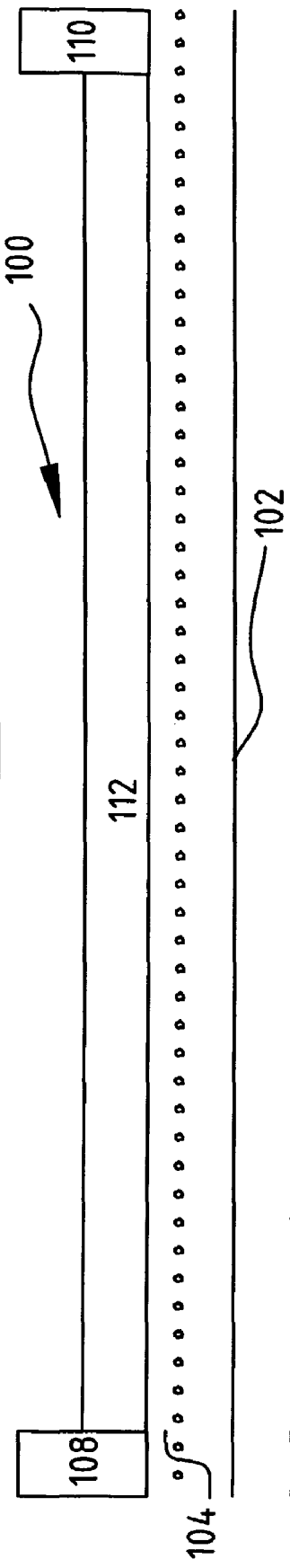
FIG. 4 is a diagram of a solar cell according to the present invention.

A solar cell 100 according to the present invention comprises a silicon substrate 102 wherein a p-n or a n-p junction, indicated by the dotted line, is arranged by doping layer 104 (FIG. 4). On one side of the substrate metal contact layer 106 is applied. On the opposite side of the substrate, metal contacts 108, 110 are arranged through insulating silicon nitride layer 112.

Layer 112 has material properties making it suitable as a antireflection layer and/or passivation layer, i.e. a uniform thickness equal to ¼ of the most relevant incident wavelength divided by the refractive index of the layer itself at this incident wavelength, a refractive index $1.9<n<2.1$ and an extinction coefficient $\kappa<0.002$.

Figure 5:
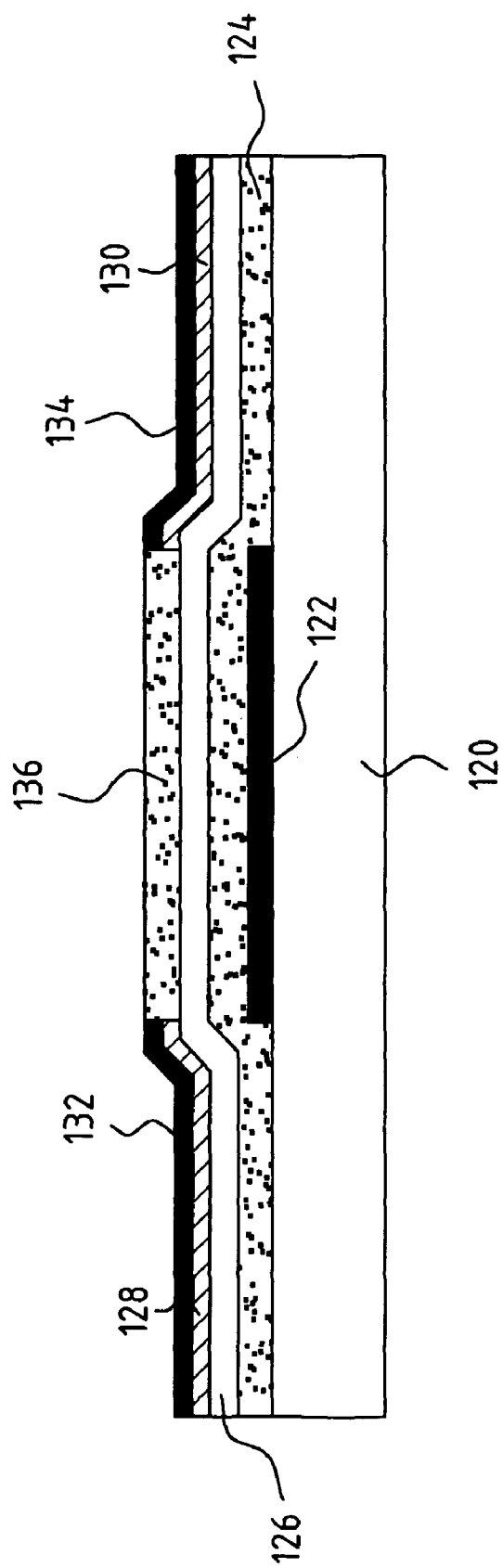
FIG. 5 is a diagram of a thin film transistor according to the present invention.

A thin film transistor (TFT) according to the present invention (FIG. 5) comprises a substrate 120 whereon a metal contact 122 is arranged. A silicon nitride dielectric layer 124 covers the metal contact 122 and one side of the substrate. The dielectric layer 124 is covered by a semiconducting layer 126 of undoped amorphous or microcrystalline silicon. Contacts for the drain and source are formed by semiconducting layers 128, 130 of doped amorphous of microcrystalline silicon and metal layers 132, 134. A second dielectric layer 136 is deposited between the contacts 132, 134. The layers 124 and 136 are deposited using the above described method.

Preferably at least one of layers 126, 128 is deposited using the method described in European patent application 9707195 of Debye Instituut, Universiteit Utrecht. Such layer combines the advantages of the above process with the advantages of the layer of EP-9707195. Such Si:H layer provides a semiconductor device, in particular being a thin film transistor, having a threshold gate voltage which remains constant after applying gate voltage. Test samples showed that the threshold voltage remained unchanged after applying 25 V for 2.5 hours at the gate. Also the device has a saturation mobility μ greater than 0.001 up to about 100 $cm^2/Vs$ and most preferably from about 0.1 to about 2 $cm^2/Vs$.

The present invention is not limited to the above described preferred embodiments thereof, wherein many modifications are possible, although the scope of protection is defined by the appended claims.

The invention claimed is:

1. An apparatus for providing a silicon nitride layer, comprising:
    a deposition chamber which can be evacuated via a pumping system, the pumping system being arranged to provide a gas pressure in the deposition chamber during film formation, the pressure being in a range of 0.05 mbar and 0.5 mbar;
    a number of filaments which are arranged in the deposition chamber, which filaments are coupleable to an exterior electrical power source, and the filaments can be heated to reach a temperature prior to film formation between 1800° C. and 2500° C., by passing a current through the filaments from said exterior electrical power source; and
    a gas dosage system arranged at a predetermined distance of the filaments for introducing a gas mixture of silane ($SiH_4$) and ammonia ($NH_3$) in the deposition chamber with a flow ratio between 1:50 and 1:9, a distance between the filaments and a substrate being between 2 cm and 5 cm, and a distance between the gas dosage system and the filaments being between 1 cm and 6 cm.

2. The apparatus as claimed in claim 1, comprising a displaceable shutter element to shield the substrate.

3. The apparatus as claimed in claim 1, comprising a heater element for heating the substrate.

4. The apparatus as claimed in claim 1, comprising a load chamber for loading the substrate into the apparatus, wherein the load chamber is coupled to the deposition chamber via a valve.

5. The apparatus as claimed in claim 1, comprising an exit load lock chamber for removing substrates from the apparatus, wherein the exit load lock chamber is coupled to the deposition chamber via a valve.

6. The apparatus as claimed in claim 1, comprising conveyor means for placing substrates thereon, wherein the conveyor means are arranged in close proximity along the filaments for moving the substrates along the filaments.

7. The apparatus as claimed in claim 1, wherein a distance d between the filaments is between 2 cm and 5 cm.

8. The apparatus as claimed in claim 1, wherein the filaments can be heated for reaching a temperature prior to film formation between 2100° C. and 2300° C.

9. The apparatus as claimed in claim 1, wherein the gas dosage system is arranged for introducing the gas mixture of silane (SiH4) and ammonia (NH3) in the deposition chamber with a flow ratio between 1:20 and 1:10.

10. The apparatus as claimed in claim 1, wherein the pumping system is arranged to provide a gas pressure in the deposition chamber during film formation which is between 0.1 mbar and 0.4 mbar.

11. A method for forming a silicon nitride layer, comprising the steps of:
   introducing a substrate into a deposition chamber;
   at least partially evacuating the deposition chamber;
   heating filaments which are arranged in the deposition chamber to a predetermined temperature, the filament temperature prior to film formation being between 1800° C. and 2500° C.;
   introducing a gas flow into the deposition chamber using a gas dosage system for forming a film on the substrate, the gas flow comprising silane ($SiH_4$) and ammonia ($NH_3$) in a flow ratio between 1:50 and 1:9;
   maintaining a gas pressure during film formation within a range of 0.05 mbar and 0.5 mbar;
   closing the gas flow; and
   removing the substrate from the deposition chamber, wherein a distance between the filaments and the substrate is between 2 cm and 5 cm, and a distance between the gas dosage system and the filaments is between 1 cm and 6 cm.

12. The method as claimed in claim 11, wherein a total gas flow rate of the silane and ammonia is higher than 4 sccm per $cm^2$ of substrate area to be deposited on.

13. The method as claimed in claim 11, wherein a substrate temperature during the film formation is between 300° C. and 600° C.

14. The method as claimed in claim 11, wherein the filament temperature prior to film formation is between 2100° C. and 2300° C.

15. The method as claimed in claim 11, wherein a total gas flow rate of the silane and ammonia is higher than 10 sccm per $cm^2$ of substrate area to be deposited on.

16. The method as claimed in claim 11, wherein the gas flow comprises silane (SiH4) and ammonia (NH3) in a flow ratio between 1:20 and 1:10.

17. The method as claimed in claim 11, wherein the gas pressure during film formation is between 0.1 mbar and 0.4 mbar.

18. The method as claimed in claim 11, wherein a substrate temperature during the film formation is between 400° C. and 500° C.

* * * * *